United States Patent [19]

Movchan et al.

[11] 4,126,811

[45] Nov. 21, 1978

[54] ELECTRON GUN WITH LINEAR THERMIONIC CATHODE FOR ELECTRON-BEAM HEATING

[76] Inventors: Boris A. Movchan, ulitsa Darvina, 7, kv. 7; Viktor A. Timashov, Vozdukhoflotsky prospekt, 5, kv. 10; Nikolai V. Chaika, ulitsa Kikvidze, 28, kv. 20, all of Kiev, U.S.S.R.

[21] Appl. No.: 806,706

[22] Filed: Jun. 30, 1977

[51] Int. Cl.² .................. H01J 29/46; H01J 29/48
[52] U.S. Cl. ..................... 313/453; 219/121 EB
[58] Field of Search ............... 219/121 EB; 313/453, 313/452

Primary Examiner—Robert Segal
Attorney, Agent, or Firm—Lackenbach, Lilling & Siegel

[57] ABSTRACT

An electron gun comprises a linear thermionic cathode having part of its emitting surface facing an accelerating anode, and the rest of the emitting surface separated by a gap from a cathode-adjacent focusing electrode. The cathode-adjacent focusing electrode is made of two portions spaced apart. On the opposite end surfaces of these portions, there is attached a pair of flat current-conducting springs whose other ends are connected to leads. The other end surfaces of these portions accommodate cathode holders and have a pair of flat springs attached thereto, the other ends of the pair of flat springs being connected to the insulator of the electron gun housing. The pairs of flat springs attached to different portions of the focusing electrode deflect towards each other. The proposed electron gun increases the stability of its electron-optical parameters.

7 Claims, 6 Drawing Figures

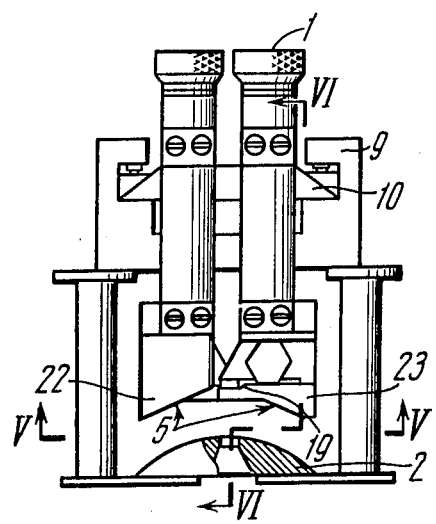
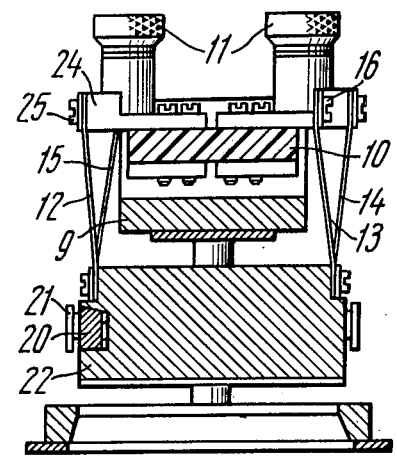
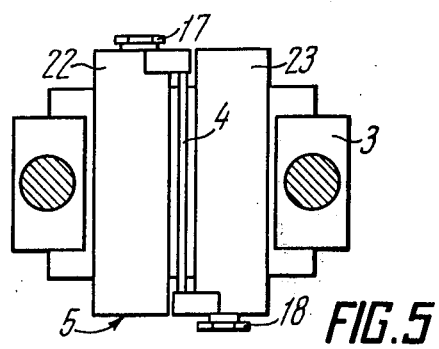
FIG. 4
FIG. 6
FIG. 5

ELECTRON GUN WITH LINEAR THERMIONIC CATHODE FOR ELECTRON-BEAM HEATING

FIELD OF THE INVENTION

The present invention relates to devices for heating materials in vacuum and, more particularly, to an electron gun with a linear thermionic cathode for electron-beam heating of materials.

The invention can be most advantageously used for heating, melting and evaporating materials in a vacuum.

DESCRIPTION OF THE PRIOR ART

In prior art electron guns with linear, directly heated thermionic cathodes, the cathode is so secured in holders that its longitudinal tension is ensured either by leverage or by means of flat spring-type leads.

In such electron guns, the cathode attachment systems fail to provide for a sufficiently stable position relative to the cathode-adjacent focusing electrode in the course of operation, which adversely affects the electron-optical parameters of the gun.

For example, changes in the conditions under which the electron beam is initially formed, caused by changes in the thermionic cathode's position, bring about variations in the beam's convergence angle, an increase in the deflection of electrons towards the accelerating anode and, hence, variations in the shape of the focal spot on the surface being heated and in the specific beam power in the focal spot. Such variations in the above electron-optical parameters of the electron gun substantially impair the stability of the processes of heating, melting and evaporation of materials.

An electron gun with a linear thermionic cathode for electron-beam heating of materials is known, which comprises a cathode assembly and an accelerating anode interconnected via an insulator. The cathode assembly includes the linear thermionic cathode which is placed in the recess of a cathode-adjacent focusing electrode secured in the housing of the cathode assembly. The ends of the thermionic cathode are secured in cathode holders connected to clamp-type leads by means of flat current-conducting springs. The clamp-type leads are arranged on the insulator of the cathode assembly housing.

In the above-described electron gun, the current-conducting springs to which the thermionic cathode is attached via the cathode holders, elongate during heating. As a result, the position of the thermionic cathode relative to the cathode adjacent focusing electrode slightly changes. Another factor responsible for the change in the thermionic cathode's position and deflection of its central portion is, in this structural arrangement, the displacement of the point of its attachment to the cathode holders, during elongation of the thermionic cathode due to heating, along an arc with a radius equal to the length of the current-conducting springs. As is known, a change in the position of a thermionic cathode relative to the cathode-adjacent focusing electrode, in an electron gun, even by tenths of a millimeter materially affects the beam focusing.

It is also well known that the magnetic field created by the heater current flowing through a thermionic cathode changes the initial path of the electron beam produced by the electron gun. As a result, when the electron gun power is adjusted by varying the heater current, the stability of the electron beam path is reduced, and the fluctuations of the cathode heater source voltage cause jittery movement of the electron beam over the surface being heated.

The above factors substantially impair the stability of the electron-optical parameters of an electron gun.

SUMMARY OF THE INVENTION

It is therefore, an object of the present invention to provide an electron gun with a linear thermionic cathode for electron-beam heating of materials, which ensures high stability of its electron-optical parameters.

This object is attained by an electron gun with a linear thermionic cathode for electron-beam heating of materials. The cathode assembly includes the linear thermionic cathode, a cathode-adjacent focusing electrode intended to produce, together with an accelerating anode, an electron beam from a flow of electrons emitted by a part of the emitting surface of the linear thermionic cathode, the rest of the emitting surface being separated by a gap from the focusing electrode, and leads secured on an insulator of the cathode assembly housing with two flat current conducting springs having their ends attached to said leads. According to the invention, the cathode-adjacent focusing electrode is made up of two portions spaced apart, the other ends of the flat current-conducting springs being attached to respective opposite end surfaces, of the portions. Two additional flat springs are provided, their ends being connected to the other end surfaces of the cathode-adjacent focusing electrode and to the insulator of the housing, respectively. Both pairs of springs deflect towards each other. The cathode holders are arranged on the end surfaces of both portions of the focusing electrode to which the additional springs are attached.

The linear thermionic cathode should preferably be placed in the gap between the portions of the cathode-adjacent focusing electrode, said portions being arranged symmetrically relative to the longitudinal axis of the thermionic cathode.

The other ends of the additional flat springs could also be attached to the insulator of the cathode assembly housing by means of holders.

It is advisable to make recesses in the opposite end surfaces of the focusing electrode portions to accommodate the ends of the linear thermionic cathode, each cathode holder being made as an insert contacting a respective end of the linear thermionic cathode and securing it in the recess by means of a screw.

The present invention increases the stability of the electron-optical parameters of an electron gun, which improves the stability and repeatability of the parameters of the processes of melting and evaporation of materials in vacuum.

The proposed structural arrangement substantially improves the reliability of the electron gun in operation, facilitates replacement of the thermionic cathode, and permits using thermionic cathodes of simplest shape, such as lengths of wire or strip of a thermionic material.

BRIEF DECRIPTION OF THE DRAWINGS

The invention will be better understood from the following detailed description of specific embodiments thereof, taken in conjunction with the accompanying drawings, wherein:

FIG. 4 is an elevational view of an electron gun with the linear thermionic cathode placed in the gap between the portions of the cathode-adjacent focusing electrode, according to the invention;

FIG. 5 is a cross-sectional view taken along the line V—V of FIG. 4; and

FIG. 6 is a cross-sectional view taken along the line VI—VI of FIG. 4.

DETAILED DESCRIPTION OF THE INVENTION

Figures 1, 2:
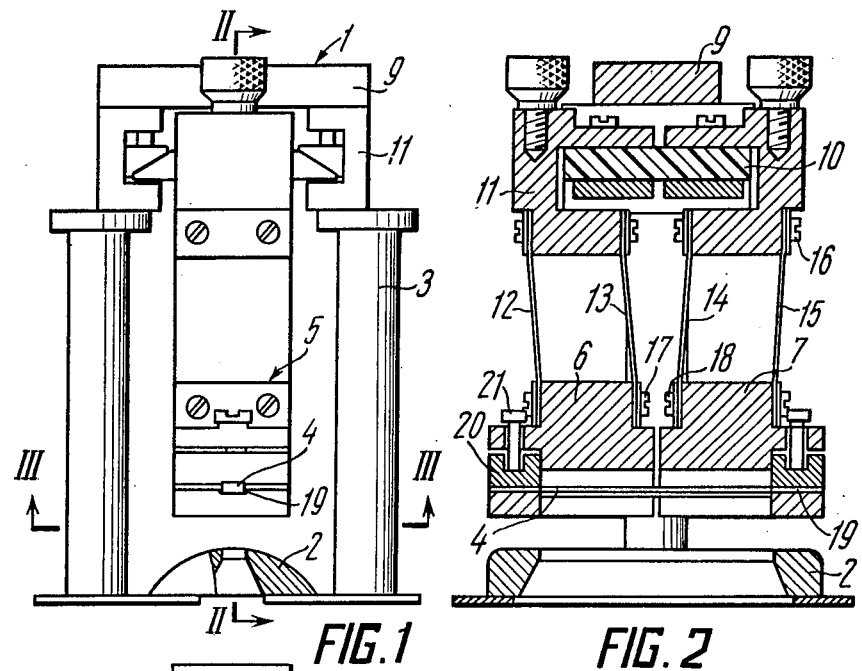
FIG. 1 is an elevational view of an electron gun with a linear thermionic cathode for electron-beam heating, according to the invention.
FIG. 2 is a cross-sectional view taken along the line II—II of FIG. 1.

Referring now to FIG. 1, the electron gun comprises a cathode assembly 1 and an accelerating anode 2 interconnected by insulating members 3. The cathode assembly 1 includes a linear thermionic cathode 4 and a cathode-adjacent focusing electrode 5. The focusing electrode 5 is made up of two portions 6 (FIG. 2) and 7 spaced apart by a gap.

Figure 3:
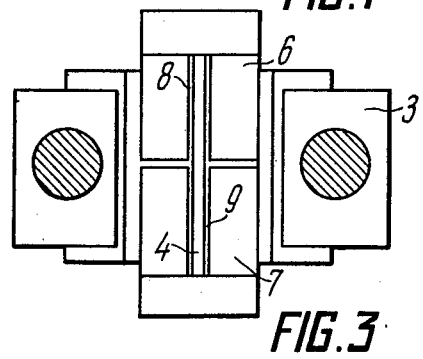
FIG. 3 is a cross-sectional view taken along the line III—III of FIG. 1.

Each portion 6 and 7 is provided, respectively, with a recess 8 (FIG. 3) and 9 accommodating the linear thermionic cathode 4.

The cathode assembly 1 (FIG. 2) also has a housing 9 with an insulator 10 to which clamp-type leads 11 and two pairs of flat parallel springs 12, and 13 and 14 and 15 are attached.

One of the ends of each flat spring 12, 13, 14 and 15 is attached to the clamp-type leads 11 by means of screws 16. The other ends of the springs 12 and 13 are secured to the end surfaces of the portion 6 of the focusing electrode 5 by means of screw 17. The other ends of the springs 14 and 15 are secured to the end surfaces of the portion 7 of the focusing electrode 5 by means of screws 18. The pairs of springs 12 and 13 and 14 and 15 deflect towards each other.

The opposite end surfaces of the portions 6 and 7 of the focusing electrode 5 are provided with recesses 19 accommodating the ends of the linear thermionic cathode 4. These ends are secured in the recesses 19 by means of cathode holders. Each cathode holder is made as an insert 20 contacting a respective end of the linear thermionic cathode 4, and a screw 21.

In the embodiment shown in FIG. 4, in contrast with that described above, the cathode-adjacent focusing electrode 5 is made up of two portions 22 and 23 separated by a gap. The linear thermionic cathode 4 is placed in this gap and the portions 22 and 23 are arranged symmetrically with respect to its longitudinal axis, as shown in FIG. 5.

The springs 12 (FIG. 6) and 14 have their ends secured to holders 24 arranged on the insulators 10 of the housing 9, by means of screws 25, rather than attached to the clamp-type leads 11, as in the previously described embodiment.

The proposed electron gun for electron-beam heating operates as follows:

As the thermionic cathode 4 (FIG. 2) expands linearly, during operation of the electron gun, as a result of being heated to the working temperature (above 2,000° C.), the portions 6 and 7 [or 22 and 23 (FIG. 4)] of the cathode-adjacent focusing electrode 5 move in parallel planes along the axis of the thermionic cathode 4 under the action of the flat springs 12, (13, 14 and 15 (FIGS. 2, 6) arranged in parallel and tensioning the thermionic cathode 4, whereby lateral deformation of the cathode 4 is precluded.

The arrangement of the cathode holders on the end surfaces of the portions 6, 7 [or 22 and 23 (FIG. 5)] ensures stability of the position of the thermionic cathode 4 relative to these portions. The magnetic fields created by the currents flowing through both portions 22 and 23 of the cathode-adjacent focusing electrode 5 are directed oppositely to the magnetic field created by the heater current flowing through the thermionic cathode 4, with partial compensation for the of the cathode 4. This is attained by the portions 22 and 23 of the cathode-adjacent focusing electrode 5 being arranged symmetrically with respect to the longitudinal axis of the linear thermionic cathode 4 placed in the gap between these portions.

The above-mentioned magnetic field compensation ensures a stabler path of the electron beam at various heater currents through the thermionic cathode 4 in the course of adjustment of the gun power and minimizes the effect of heater current fluctuations on the electron-optical parameters of the electron beam.

The proposed electron gun increases the stability of its electron-optical parameters.

What is claimed is:

1. An electron gun with a linear thermionic cathode for electron-beam heating of materials, comprising:
    a cathode assembly;
    an accelerating anode;
    an insulator interconnecting said cathode assembly and said accelerating anode;
    a cathode-adjacent focusing electrode in said cathode assembly having two portions separated by a gap;
    a linear thermionic cathode in said cathode assembly having an emitting surface, part of said emitting surface facing said accelerating anode,
    the rest of said emitting surface being separated by a gap from said focusing electrode;
    a housing of said cathode assembly having an insulator;
    leads secured on said insulator of said housing;
    a pair of flat current-conducting springs of said cathode assembly having ends connected to said leads and to opposite end surfaces of said portions of said cathode-adjacent focusing electrode, respectively;
    a pair of flat springs of said cathode assembly having ends connected to other end surfaces of said portions of said cathode-adjacent focusing electrode and to said insulator of said housing, respectively, the pairs of said flat springs and of said flat current-conducting springs connected to said portions of said focusing electrode deflecting towards each other; and
    cathode holders arranged on said end surfaces of said portions to which said pairs of flat springs are connected.

2. An electron gun as claimed in claim 1, wherein: said linear thermionic cathode is placed in said gap between said portions of said focusing electrode and arranged symmetrically with respect to the longitudinal axis of said thermionic cathode.

3. An electron gun as claimed in claim 1, further comprising: holders to secure respective ends of said flat springs on said insulator of said housing.

4. An electron gun as claimed in claim 2, further comprising: holders to secure respective ends of said flat springs on said insulator of said housing.

5. An electron gun as claimed in claim 1, wherein: recesses are made in said opposite end surfaces of said portions of said cathode-adjacent focusing electrode in which the ends of said linear thermionic cathode are accommodated;

an insert of each of said cathode holders contacts a respective one of said ends of said thermionic cathode; and a screw of each said cathode holder secures a respective one of said ends of said linear thermionic cathode in said recess.

6. An electron gun as claimed in claim 2, wherein:

recesses are made in said opposite end surfaces of said portions of said cathode-adjacent focusing electrode, in which the ends of said linear thermionic cathode are accommodated;

an insert of each of said cathode holders contacts a respective one of said ends of said thermionic cathode; and a screw of each said cathode holder secures a respective one of said ends of said linear thermionic cathode in said recess.

7. An electron gun as claimed in claim 3, wherein:

recesses are made in said opposite end surfaces of said portions of said cathode-adjacent focusing electrode, in which the ends of said linear thermionic cathode are accommodated;

an insert of each of said cathode holders contacts a respective one of said ends of said thermionic cathode; and a screw of each said cathode holder secures a respective one of said ends of said linear thermionic cathode in said recess.

* * * * *